(12) United States Patent
Gnadinger

(10) Patent No.: US 6,674,110 B2
(45) Date of Patent: Jan. 6, 2004

(54) SINGLE TRANSISTOR FERROELECTRIC MEMORY CELL, DEVICE AND METHOD FOR THE FORMATION OF THE SAME INCORPORATING A HIGH TEMPERATURE FERROELECTRIC GATE DIELECTRIC

(75) Inventor: Alfred P. Gnadinger, Colorado Springs, CO (US)

(73) Assignee: COVA Technologies, Inc., Colorado Springs, CO (US)

( * ) Notice: Subject to any disclaimer, the term of this patent is extended or adjusted under 35 U.S.C. 154(b) by 0 days.

(21) Appl. No.: 10/087,361

(22) Filed: Mar. 1, 2002

(65) Prior Publication Data

US 2002/0153542 A1 Oct. 24, 2002

Related U.S. Application Data

(60) Provisional application No. 60/272,986, filed on Mar. 2, 2001.

(51) Int. Cl.[7] .............................................. H01L 29/792
(52) U.S. Cl. ...................................... 257/295
(58) Field of Search ......................... 257/295

(56) References Cited

U.S. PATENT DOCUMENTS

| | | |
|---|---|---|
| 3,832,700 A | 8/1974 | Wu et al. |
| 4,860,254 A | 8/1989 | Pott et al. |
| 5,046,043 A | 9/1991 | Miller et al. |
| 5,060,191 A | 10/1991 | Nagasaki et al. |
| 5,070,385 A | 12/1991 | Evans, Jr. et al. |
| 5,146,299 A | 9/1992 | Lampe et al. |
| 5,198,994 A | 3/1993 | Natori |
| 5,227,855 A | 7/1993 | Momose |
| 5,302,842 A | 4/1994 | Chan |
| 5,307,305 A | 4/1994 | Takasu |
| 5,345,414 A | 9/1994 | Nakamura |
| 5,365,094 A | 11/1994 | Takasu |
| 5,378,905 A | 1/1995 | Nakamura |
| 5,384,729 A | 1/1995 | Sameshima |

(List continued on next page.)

FOREIGN PATENT DOCUMENTS

| | | |
|---|---|---|
| JP | 408055919 A | 2/1996 |
| WO | WO 98/13300 | 2/1998 |

OTHER PUBLICATIONS

Tokumitsu, Eisuke et al, "Characterization of MF(M)IS structures using P(L)ZT and $Y_2O_3$ films", Jpn. J. of Appl. Phys., vol. 39, Sep. 2000, pp. 5456–5459.

Tokumitsu, Eisuke et al, "Preparation of STN films by the sol-gel method for ferroelectric gate structures", IMF–10 Madrid/Spain (2001), pp. 105–110.

Tokumitsu, Eisuke et al, "Electrical Properties of MFIS and MFMIS FETs using ferroelectric SBT film and STO/SiON buffer layer", Jpn. J. of Appl.Phys., vol. 39, Apr. 2000, pp. 2125–2130.

(List continued on next page.)

Primary Examiner—Allan R. Wilson
(74) Attorney, Agent, or Firm—William J. Kubida; Peter J. Meza; Hogan & Hartson LLP

(57) ABSTRACT

A single transistor ("1T") ferroelectric memory cell, device and method for the formation of the same incorporating a high temperature ferroelectric gate dielectric. The memory cell of the present invention comprises a substrate, an overlying ferroelectric layer, which may comprise a film of rare earth manganite, and an interfacial oxide layer intermediate the substrate and the ferroelectric layer. In a preferred embodiment, the ferroelectric material utilized in an implementation of the present invention may be deposited by metallorganic chemical vapor deposition ("MOCVD") or other techniques and exhibits a low relative dielectric permittivity of around 10 and forms an interfacial layer with a relative dielectric permittivity larger than that of $SiO_2$, which makes it particularly suitable for a 1T cell.

9 Claims, 5 Drawing Sheets

U.S. PATENT DOCUMENTS

| | | | |
|---|---|---|---|
| 5,418,389 A | * | 5/1995 | Watanabe ................... 257/295 |
| 5,434,811 A | | 7/1995 | Evans, Jr. et al. |
| 5,479,317 A | | 12/1995 | Ramesh |
| 5,515,311 A | | 5/1996 | Mihara |
| 5,519,235 A | | 5/1996 | Ramesh |
| 5,523,964 A | | 6/1996 | McMillan et al. |
| 5,536,672 A | | 7/1996 | Miller et al. |
| 5,541,870 A | | 7/1996 | Mihara et al. |
| 5,541,871 A | | 7/1996 | Nishimura et al. |
| 5,541,873 A | | 7/1996 | Nishimura et al. |
| 5,559,733 A | | 9/1996 | McMillan et al. |
| 5,563,081 A | | 10/1996 | Ozawa |
| 5,578,846 A | | 11/1996 | Evans, Jr. et al. |
| 5,621,681 A | | 4/1997 | Moon |
| 5,623,439 A | | 4/1997 | Gotoh et al. |
| 5,736,759 A | | 4/1998 | Haushalter |
| 5,739,563 A | | 4/1998 | Kawakubo et al. |
| 5,744,374 A | * | 4/1998 | Moon ........................... 438/3 |
| 5,757,042 A | | 5/1998 | Evans, Jr. et al. |
| 5,768,185 A | | 6/1998 | Nakamura et al. |
| 5,780,886 A | * | 7/1998 | Yamanobe ................. 257/295 |
| 5,789,775 A | | 8/1998 | Evans, Jr. et al. |
| 5,808,676 A | | 9/1998 | Biegelsen et al. |
| 5,822,239 A | | 10/1998 | Ishihara et al. |
| 5,825,317 A | | 10/1998 | Anderson et al. |
| 5,858,533 A | | 1/1999 | Greuter et al. ............... 428/404 |
| 5,872,739 A | | 2/1999 | Womack |
| 5,877,977 A | | 3/1999 | Essaian |
| 5,886,920 A | | 3/1999 | Marshall et al. |
| 5,887,117 A | | 3/1999 | Desu et al. |
| 5,919,515 A | | 7/1999 | Yano et al. |
| 5,946,224 A | | 8/1999 | Nishimura |
| 5,953,061 A | | 9/1999 | Biegelsen et al. |
| 5,955,213 A | | 9/1999 | Yano et al. |
| 5,959,879 A | * | 9/1999 | Koo ........................... 365/145 |
| 5,962,884 A | | 10/1999 | Hsu et al. |
| 5,977,577 A | | 11/1999 | Evans, Jr. |
| 5,998,819 A | | 12/1999 | Yokoyama et al. |
| 6,025,735 A | | 2/2000 | Gardner et al. |
| 6,027,947 A | | 2/2000 | Evans et al. |
| 6,031,754 A | | 2/2000 | Derbenwick et al. |
| 6,066,868 A | | 5/2000 | Evans, Jr. |
| 6,067,244 A | | 5/2000 | Ma et al. |
| 6,069,381 A | | 5/2000 | Black et al. |
| 6,087,688 A | | 7/2000 | Furuta et al. |
| 6,091,621 A | | 7/2000 | Wang et al. |
| 6,104,049 A | | 8/2000 | Solayappan et al. |
| 6,121,648 A | | 9/2000 | Evans, Jr. |
| 6,130,103 A | | 10/2000 | Cuchiaro et al. |
| 6,140,672 A | | 10/2000 | Arita et al. |
| 6,144,579 A | | 11/2000 | Taira |
| 6,147,895 A | | 11/2000 | Kamp |
| 6,150,184 A | | 11/2000 | Evans et al. |
| 6,151,241 A | | 11/2000 | Hayashi et al. |
| 6,151,242 A | | 11/2000 | Takashima |
| 6,165,802 A | | 12/2000 | Cuchiaro et al. |
| 6,171,934 B1 | | 1/2001 | Joshi et al. |
| 6,194,751 B1 | | 2/2001 | Evans, Jr. |
| 6,201,731 B1 | | 3/2001 | Kamp et al. |
| 6,207,465 B1 | | 3/2001 | Cuchiaro et al. |
| 6,225,156 B1 | | 5/2001 | Cuchiaro et al. |
| 6,225,654 B1 | | 5/2001 | Evans, Jr. et al. |
| 6,225,656 B1 | | 5/2001 | Cuchiaro et al. |
| 6,236,076 B1 | | 5/2001 | Arita et al. |
| 6,245,451 B1 | | 6/2001 | Kamisawa et al. |
| 6,245,580 B1 | | 6/2001 | Solayappan et al. |
| 6,246,602 B1 | | 6/2001 | Nishimura |
| 6,255,121 B1 | | 7/2001 | Arita et al. |
| 6,256,220 B1 | | 7/2001 | Kamp |
| 6,285,577 B1 | | 9/2001 | Nakamura |
| 6,307,225 B1 | | 10/2001 | Kijima et al. |
| 6,310,373 B1 | | 10/2001 | Azuma et al. |
| 6,319,542 B1 | | 11/2001 | Summerfelt et al. |
| 6,322,849 B2 | | 11/2001 | Joshi et al. |
| 6,326,315 B1 | | 12/2001 | Uchiyama et al. |
| 6,335,550 B1 | | 1/2002 | Miyoshi et al. |
| 6,339,238 B1 | | 1/2002 | Lim et al. |
| 6,358,758 B2 | | 3/2002 | Arita et al. |
| 6,362,068 B1 | | 3/2002 | Summerfelt et al. |
| 6,365,927 B1 | | 4/2002 | Cuchiaro et al. |
| 6,370,056 B1 | | 4/2002 | Chen et al. |
| 6,372,518 B1 | | 4/2002 | Nasu et al. |
| 6,373,743 B1 | | 4/2002 | Chen et al. |
| 6,396,093 B1 | | 5/2002 | Nakamura |
| 6,396,095 B1 | | 5/2002 | Shimada et al. |
| 6,469,334 B2 | * | 10/2002 | Arita et al. ................. 257/295 |
| 2002/0083959 A1 | * | 7/2002 | Morita et al. ................. 134/1.3 |

OTHER PUBLICATIONS

Shin, Chang Ho et al, "Fabrication and characterization of MFIS FET using $Al_2O_3$ insulating layer for nonvolatile memory", ISIF 2001, 9 pages.

Lee, Ho Nyung et al., "CV characteristics of $Pt/SBT/CeO_2/Si$ structure for non volatile memory devices", ISIF, 4 pages. No date.

Choi, Hoon Sang et al, "Crystal Structure and electrical properties of $Pt/SBT/ZrO_2/Si$", J. of Korean Phys. Soc., vol. 39, No. 1, Jul. 2001, pp. 179–183.

Li, W.P. et al, "Improvement of MFS structures without buffer layers betewwn Si and ferroelectric film", Applied Physics A, Springer (2000), pp. 85–87.

Han, Jin–Ping et al, "Memory effects of SBT capacitors on silicon with silicon nitride buffer", Integrated Ferroelectrics, 1998, vol. 22, pp. 213–221.

Miller, S.L. and McWhorter, P.J., "Device Physics of the ferroelectric memory field effect transistor", ISIF Jun. 1992, pp. 5999–6010.

Kalkur, T.S., "Characteristics of MFS capacitors and MFS-FETs with $BaMgF_4$ gate dielectrics", ISIF 1992. 1 page.

Wu, S.Y., IEEE Trans.Electron Devices ED 21, 499 (1974). An excellent review article referencing the same work was published in 1992 by Sinharoy, S. et al, "Integration of ferroelectric thin films into nonvolatile memories", J.Vac. Sci.Technol.A 10(4), Jul./Aug. 1992, pp. 1554–1561.

Chung, Ilsub et al., "Data Retention: Fabrication and characterization of MFISFET using CMOS process for single transistor memory applications", Integrated Ferroelectrics, 1999, vol. 27, pp. 31–39.

Miller, S.L. and McWhorter, P.J., "Theoretical investigation of a ferroelectric transistor: Physics of the ferroelectric nonvolatile memory field effect transistor", J. Appl.Phys. 72(12), Sep. 9, 1992, pp. 5999–6010.

Smyth, D.M., "Charge Motion in ferroelectric thin films", Ferroelectrics, vol. 116, pp. 117–124 (1991), pp. 117–124.

Wu, S.Y. "A ferroelectric memory device, Metal–Ferroelectric–Semiconductor Transistor", IEEE Trans.Electron Devices, vol. ED–21, No. 8, Aug. 1994, pp. 499–504.

Moshnayaga, V. et al., "Preparation of rare–earth manganite–oxide thin films by metalorganic aerosol deposition technique", Appl. Phys. Lett., vol. 74, No. 19, pp 2842–2844 (1998).

Kim, Kwang–Ho, "Metal–Ferroelectric—Semiconductor (MFS) FET's using LiNbO3/Si (100) Structures for non-volatile memory applications", IEEE Electron Device Letters, vol. 19, No. 6, pp. 204–206 (Jun. 1998).

* cited by examiner

SINGLE TRANSISTOR FERROELECTRIC MEMORY CELL, DEVICE AND METHOD FOR THE FORMATION OF THE SAME INCORPORATING A HIGH TEMPERATURE FERROELECTRIC GATE DIELECTRIC

CROSS REFERENCE TO RELATED PATENT APPLICATIONS

The present invention is related to, and claims priority from, the subject matter disclosed in U.S. Provisional Patent Application 60/272,986 filed Mar. 2, 2001 for: "Single Transistor Ferroelectric Memory Device with High Temperature Ferroelectric Gate Dielectric" the disclosure of which is herein specifically incorporated in its entirety by this reference.

BACKGROUND OF THE INVENTION

The present invention relates, in general, to the field of nonvolatile memory devices. More particularly, the present invention relates to a nonvolatile memory device utilizing a single transistor as the only element in the memory cell and a method for the formation of such an element incorporating a ferroelectric material as the gate dielectric thin film formed at a relatively high temperature.

Nonvolatile ferroelectric random access memory ("FeRAM") devices represent an emerging, multibillion-dollar market. The most advanced FeRAMs utilize a 1-transistor/1 capacitor ("1T1C") cell technology and a destructive read out ("DRO") scheme. These devices compete with electrically erasable programmable read only memory ("EEPROMs"), battery backed static random access memory ("RAM"; "BBSRAMs"), and Flash nonvolatile memory devices.

FeRAM is a type of semiconductor memory, constructed similarly to a dynamic random access memory ("DRAM") device, but which stores bits of data without the need for a continuous power requirement (nonvolatile characteristic). FeRAMs have gained recent interest because of the possibility that they could become the ideal memory of the future, also replacing standard mass-produced DRAM. Although the basic fundamentals of ferroelectricity were discovered in the 1920's, developments within the last fifteen years regarding the use of thin ferroelectric films may now make it practical to develop a dense memory with ideal nonvolatile memory performance characteristics. Ferroelectric materials exhibit ferroelectric behavior below a critical temperature, known as the Curie temperature. The Curie temperatures of many ferroelectric materials are above 200° C. allowing them to be used as storage elements for nonvolatile semiconductor memories.

Conventional FeRAMs operate using an array of memory cells, which contain capacitors, built of a special dielectric material (a ferroelectric) sandwiched between two conducting material (electrode) layers. The special ferroelectric material is comprised of a lattice of ions, in which one of the ions in each unit cell has two stable states on either side of the center of the unit cell along an elongated axis as shown in FIGS. 1A and 1B. When a voltage is applied across the top and bottom electrodes of a ferroelectric capacitor, the movement of these charged center ions creates a charge displacement within the dielectric. This charge displacement can be sensed as a current flowing between the electrodes of the ferroelectric capacitor. The charge displacement within a ferroelectric capacitor is often displayed as a hysteresis curve, where the polarization (or polarization charge) of the ferroelectric layer is plotted against the applied electric field (or applied voltage), as shown in FIG. 1C.

FIG. 1D shows a schematic of a conventional 1T1C memory cell. When a positive voltage is applied across a negatively polarized ferroelectric capacitor, the center ions of the unit cells switch to positively polarized states. This ion movement can be sensed as a current flow between the electrodes of the ferroelectric capacitor. When this voltage is removed, the polarization settles to the state labeled "$+Q_0$" (See FIG. 1C). If a negative voltage is then applied across the ferroelectric capacitor, the center ions of the unit cells switch to negatively polarized states. When this voltage is removed, the polarization settles to the state labeled "$-Q_0$". FeRAMs offer an advantage over DRAMs because ferroelectric polarization can be retained in either state, $+Q_0$ or $-Q_0$, for a very long time (retention) without continuously applied power (non-volatility). Unlike other nonvolatile memory elements, ferroelectric capacitors can be switched from state to state many times (currently $>10^{10}$ cycles) without wear-out (fatigue). Also, because the ferroelectric capacitors operate at a relatively low voltage, there is no need for high voltages provided by charge pumps to program (or "write") the memory as required for certain nonvolatile memories (e.g., EEPROM and Flash). These low programming voltages ultimately allow ferroelectric memory cells to scale to smaller dimensions than Flash memory and improve radiation hardness.

Conventional techniques for processing FeRAMs require the fabrication of ferroelectric capacitors after all of the underlying complementary metal oxide semiconductor ("CMOS") circuitry has been fabricated just prior to metalization. A typical cross section of a 1T1C cell would exhibit a ferroelectric capacitor placed on the field oxide which is connected to the associated pass transistor with a local interconnect. This presents a significant processing difficulty, because the proper ferroelectric phase has to be formed after deposition by a high temperature anneal operation, preferably in an oxygen atmosphere. When the underlying CMOS circuitry is heated to high temperatures, hydrogen is released, which degrades the ferroelectric film. Depositing the metalization interconnect layers can also produce hydrogen. Thus, a hydrogen barrier must be added to protect the ferroelectric capacitors. Also, some ferroelectric materials are very sensitive to moisture, which contamination can be formed when hydrogen is released. Finally, when relatively dense memory arrays are fabricated, planarization techniques are commonly used. Most processes require interconnect metalization to be added before the ferroelectric materials are deposited and activated. This interconnect metalization will generally not withstand the high temperatures of ferroelectric film activation. All of these problems have slowed the development of dense FeRAMs and have clouded the future for an ideal memory.

A particularly significant disadvantage of prior art 1T1C cell memories is that, under the best of circumstances, they cannot be scaled aggressively enough to compete with Flash memory since they require 2 elements per cell compared to a single element in Flash devices. With comparable design rules, a conventional FeRAM device will exhibit a cell size at least twice the cell size of Flash memory.

SUMMARY OF THE INVENTION

Disclosed herein is a memory cell, device and method for producing the same which advantageously includes a memory cell comprising a single transistor. This transistor is formed, for example, utilizing a rare earth manganite as the thin film ferroelectric material that forms part of the gate dielectric of the ferroelectric transistor. This ferroelectric gate material may be deposited directly on silicon instead of a metallic or conductive oxide bottom electrode as in prior art ferroelectric devices. In order to form a ferroelectric transistor, the ferroelectric material has to be inserted relatively early in the CMOS process. It has, therefore, to be able to withstand higher temperatures, most likely up to and on the order of 950° C., (e.g. the activation temperature for the implanted source and drain junctions).

The requirements for the ferroelectric gate material in accordance with the technique of the present invention are quite different from the ones encountered in a conventional 1T1C cell. In addition to the high temperature requirements, it should also have a relatively low dielectric constant, preferably on the order of less than 20. The reason for this is that any ferroelectric material deposited on silicon forms an interfacial layer with a rather low dielectric constant, most likely around 3.9, the value for $SiO_2$. A voltage applied to the gate of the transistor is, therefore, divided between the ferroelectric material and the interfacial layer. If the capacitance of the interfacial layer is much smaller than the capacitance of the ferroelectric layer, most of the voltage will drop over the interfacial layer and is not available for switching the ferroelectric material. It is, therefore, not possible to operate the device at low voltages. The ferroelectric material and technique of the present invention exhibits a low relative dielectric permittivity of around 10 and forms an interfacial layer with a relative dielectric permittivity larger than that of $SiO_2$, which makes it particularly suitable for a 1T cell.

The ferroelectric material of the present invention is also substantially different from known ferroelectric materials such as lead zirconate titanate ("PZT") and strontium bismuth tantalate ("SBT"), which are the preferred ferroelectric materials in current use. A device in accordance with a preferred embodiment of the present invention may include a substrate such as silicon, a thin film of a rare earth manganite (or "manganate"; the terms may be used in an equivalent sense herein since a broad range of compositions is contemplated [i.e. x,y,z from 0.1 to 10] with the term "manganate" usually being associated with a +2 oxidation state and the term "manganite" being associated with a +3 oxidation state) as the ferroelectric material deposited directly onto this substrate and an electrode formed on top of the ferroelectric material. Source and drain regions may be formed either before or after the ferroelectric layer deposition. The device is provided with contacts to the source and drain regions and to the gate electrode. Standard metalization (e.g. aluminum, or other conductive materials) is used to connect these contacts to other elements in an integrated circuit device, such as a CMOS circuit, and to external circuit elements.

The ferroelectric material utilized in the implementation of the present invention, as previously mentioned, may be deposited directly on silicon and is composed of any rare-earth manganite, or similar materials such as Yttrium manganite or Scandium manganite, with the formula $A_xMn_yO_z$ (where A=Y, Ce, Pr, Nd, Pm, Sm, Eu, Gd, Tb, Dy, Ho, Er, Tm, Yb, Lu or Sc) and x,y,z are substantially between 0.1 and 10.

The rare earth manganites used in a representative implementation of the present invention have been demonstrated to possess the desired properties for successful operation of a 1T memory cell. Further, they appear to have typical dielectric permittivities of less than 20, they generally form a stable interfacial layer with a relatively high dielectric constant of ~30, they exhibit high transition temperatures (Curie temperature) of typically >600° C. and they have inherently low mobile charges (e.g. oxygen vacancies). In order for 1T devices to exhibit good retention, mobile ionic charges in the ferroelectric film have to be minimized. Rare earth manganates have low oxygen vacancy concentration, the most significant of the ionic mobile charges. Still further, the ferroelectric polarization is in the ideal range of substantially 0.1 to 2 $\mu C/cm^2$.

Rare earth manganites are high temperature materials which means that they are ideal for forming ferroelectric transistors which have to withstand a considerable thermal budget. Most rare earth manganites (e.g. $YMnO_3$ and $CeMnO_3$) require a high temperature treatment (anneal) of typically at least 850° C. in an $O_2$ atmosphere for approximately an hour in order to form the proper ferroelectric phase. The processing window is approximately 100 to 200° C., which means that they are able to withstand heat treatments of 950 to 1050° C., well above the thermal budget of a modern CMOS process.

The ferroelectric materials utilized in the implementation of the present invention may be deposited, preferably, by metallorganic chemical vapor deposition ("MOCVD") techniques, although other methods such as plasma enhanced chemical vapor deposition ("PECVD"), metal-organic decomposition ("MOD") or other techniques could be used. In a representative embodiment of the present invention, the MOCVD process may be preferred as it tends to minimize ionic contamination (e.g. Na+) which is detrimental to data retention in a final 1T cell device. The MOCVD process may preferably employ a liquid source delivery and flash evaporation method, since the precursors preferably used typically have low vapor pressure, making other methods such as vapor delivery with bubblers more difficult. Examples of precursors which might be used for $CeMnO_3$, used in a particular embodiment of the present invention, are Cerium (IV) tris-tetramethylheptanedionate (thd) for Cerium (Ce) and Manganese (III) tris-tetramethylheptanedionate for Manganese (Mn). These materials are solid powders and can be brought into solution with tetrahydrofuron ("THF") as the solvent with tetraglyme added to prevent any early evaporation problems.

The exemplary MOCVD process disclosed herein produces rare earth manganite thin films with low mobile ion contamination, excellent uniformity, good step coverage and excellent compositional control. Importantly, it produces a well controlled interfacial layer of $Si_xO_yA_z$ that is enhanced by the subsequent anneal steps in $O_2$.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1A:
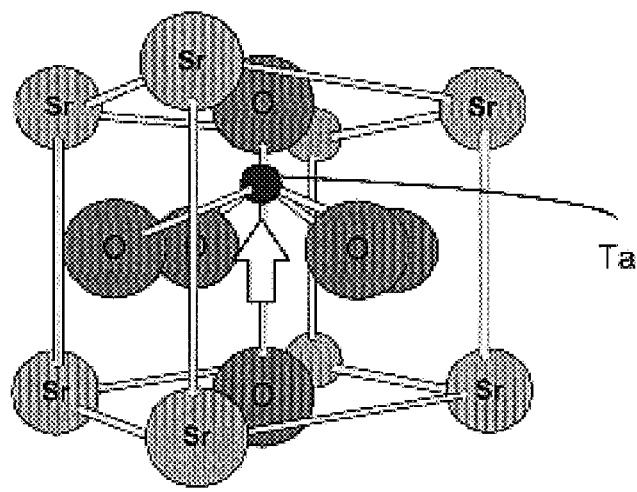
FIGS. 1A and 1B illustrate the crystal lattice of a ferroelectric material.
Figure 1B:
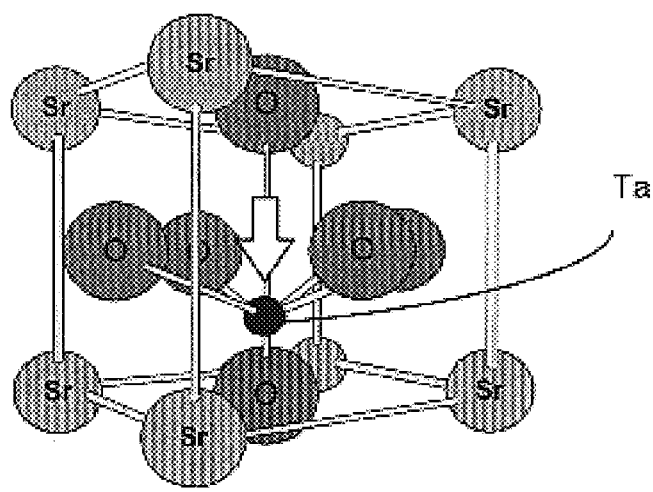
Figure 1C:
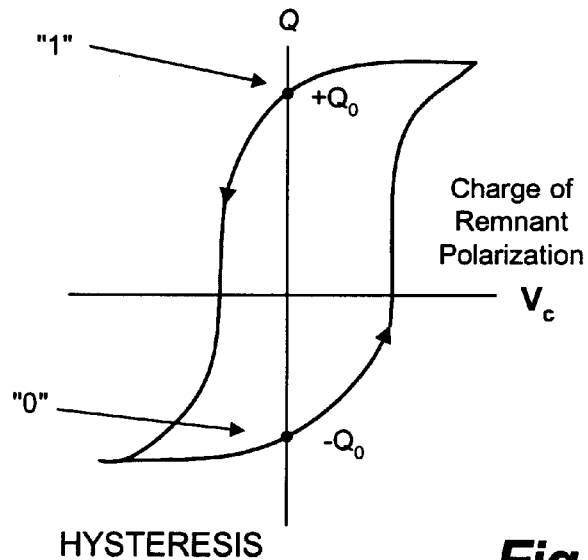
FIG. 1C is a representative hysteresis loop for a conventional ferroelectric material.
Figure 1D:
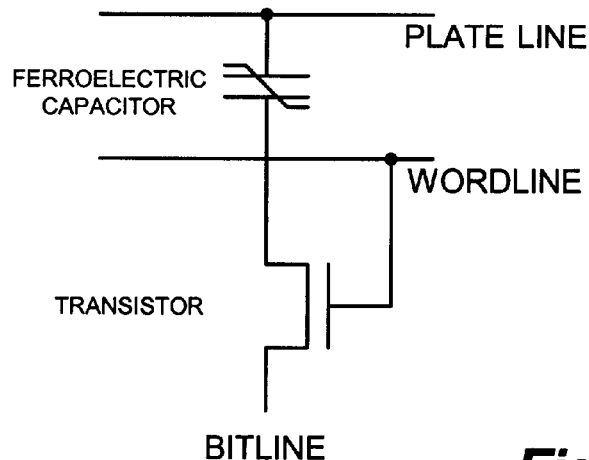
FIG. 1D is a representative schematic diagram of a prior art 1T1C memory cell.
Figure 2A:
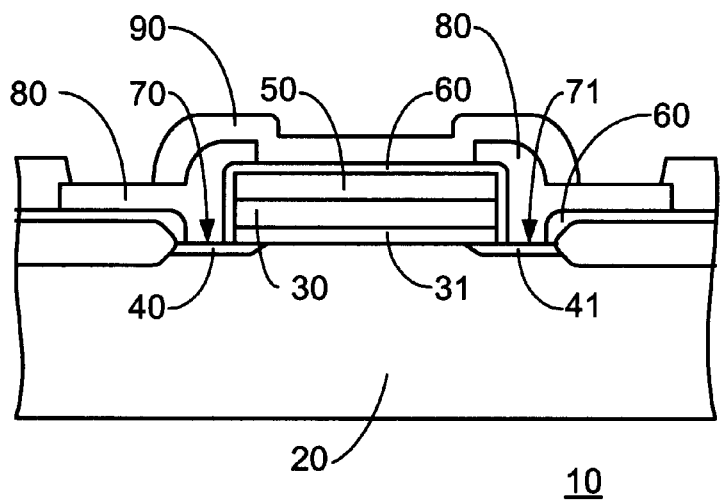
FIG. 2A is a cross-sectional view of a representative embodiment of the present invention.

With reference now to FIG. 2A, a depiction of a 1-transistor (1T) memory cell 10 in accordance with the present invention is shown. The 1T memory cell 10 comprises a substrate 20 of a suitable material such as silicon. Substrate 20 may be the starting material for a complex integrated circuit and what is shown is only a representative memory cell 10 itself. The memory cell 10 may be the building block of a larger memory array that, in turn, is interconnected with peripheral circuitry such as decoders, sense amplifiers and input/output circuitry (not shown).

A ferroelectric thin film layer 30 is, in the embodiment illustrated, deposited directly onto substrate 20. An interfacial layer 31 is then formed between the substrate 20 and ferroelectric layer 30 either automatically during deposition of ferroelectric layer 30 or deliberately as a separate processing step prior to deposition of the ferroelectric layer 30. The ferroelectric layer 30 may be deposited as hereinafter described and the interfacial layer 31 is then a mixture of the oxides of silicon and the rare earth element.

The ferroelectric layer 30 may be patterned using standard photolithography and etch techniques. Source and drain regions 40 and 41 may also be formed adjacent to the patterned ferroelectric layer 30 using standard techniques used in semiconductor processing. In practice, these regions 40 and 41 can either be formed before or after deposition of the ferroelectric layer 30. The most common technique used for source and drain formation is by ion implantation of, for example, boron for p+regions (p–channel transistors), or phosphorous or arsenic for n+regions (n-channel transistors). The use of any of these or other known techniques is within the contemplation of the present invention. Overlying the ferroelectric layer 30, a conductive gate material 50 is then deposited using standard techniques (e.g. chemical vapor deposition ("CVD"), sputtering and the like), completing a ferroelectric transistor in accordance with the present invention. The conductive gate material may be composed of platinum, gold or any other noble metal, iridium, rhodium, ruthenium or oxides thereof, doped polycrystalline silicon (e.g. an n+or p+doping with, for example, B for p+or P or As for n+), a metal silicide (such as platinum silicide) or other known materials. When used, the doping of polycrystalline silicon can occur during deposition of the polycrystalline silicon layer (in situ) or can be performed as a separate processing step after the polycrystalline silicon is deposited.

For a commercially useful transistor forming a part of an integrated circuit (e.g. CMOS), some additional processing steps may be required. An insulating layer 60 (e.g. SiO$_2$) is deposited on the gate electrode (covering the transistor), contact windows 70, 71 are etched to the source and drain regions 40, 41 and also to the gate electrode, respectively, and connections 80 may be provided by standard metalization techniques (e.g. aluminum). Finally, the device may be passivated with a suitable passivation layer 90, e.g. polyimide, plasma oxide, plasma nitride or the like.

The memory cell 10 of the present invention operates quite differently from a prior art 1T1C cell. Instead of using the switched (or non-switched) charge as a signal (as in the 1T1C DRO cell previously described) the magnitude of the drain current Iof the ferroelectric transistor is instead used to distinguish between the two logic states.

Figure 2B:
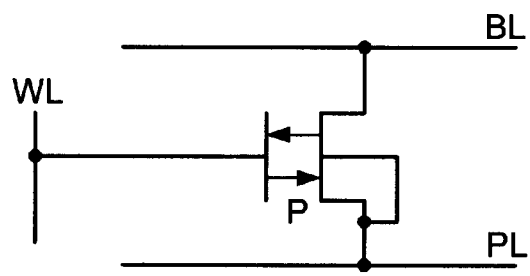
FIG. 2B depicts a corresponding schematic diagram of an embodiment of the present invention.
Figure 2C:
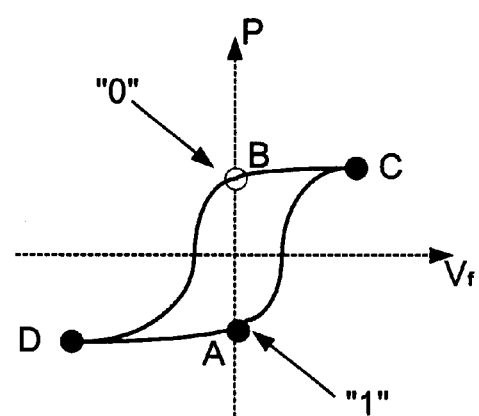
FIG. 2C illustrates a representative hysteresis loop for an embodiment of the present invention.

For example, In the 1T cell 10 of the present invention as shown in FIGS. 2A, 2B and 2C, if the polarization of the ferroelectric layer is down, the threshold voltage of the device is increased (to e.g., 1.5 volts) and the drain current is "low" (at a drain voltage V$_d$ ~0.3 volt, less than the threshold voltage), representing, for example, a logic "0". If the polarization is up, the threshold voltage of the device is decreased (to e.g., –2.5 volts) and the drain current is "high", representing, for example, a logic "1". To write a cell, the cell is selected and a positive or negative voltage is applied to the gate of the selected transistor to write either a logic "1" (polarization up) or a logic "0" (polarization down). To read a cell, the cell is selected and a small drain voltage is applied to the selected cell. The sense amplifier determines if the drain current is "high"or "low", representing a logic "1" or "0" as shown particularly with respect to FIG. 2C.

A "read" operation does not change the polarization state of the device and, therefore, does not destroy the information providing a non-destructive read-out ("NDRO") capability. The memory cell 10 does, therefore, not fatigue under a "read" operation (and only fatigues under a "write" operation) thereby providing a major advantage over conventional DRO memories. In addition to providing a fatigue-free "read" operation, a NDRO technique is ultimately faster since no "restore" operation is needed, thereby shortening the "write" cycle. NDRO operation also is potentially more reliable, especially in adverse environments (e.g., radiation) as might be encountered, for example, in military and space applications, as there is never an instance where the memory state is unidentified such that an upsetting event (e.g., single event upset "SEU") could inadvertently alter the state of the memory.

The memory cell 10 of the present invention also has a much smaller footprint than any known ferroelectric storage cell and comprises what is potentially the smallest possible ferroelectric memory cell with a density similar to that of a Flash memory cell, the densest of any competing nonvolatile semiconductor memory technologies. The challenges of building such a 1T ferroelectric memory cell 10 is that the ferroelectric material has generally to be deposited directly on silicon instead of a metallic bottom electrode as in the prior art devices. This means that requirements for the ferroelectric material are different. The switched polarization (P$_r$) should be in a range of approximately 0.1 to 1 $\mu$C/cm$^2$ and not as high as possible as in the prior art devices. Further, the dielectric permittivity should be as low as possible, ideally less than 20, and the leakage current over the operating voltage range (e.g. +–5 Volt) should also be as low as possible. This applies both to electronic and ionic charge motion in the ferroelectric material, but most importantly for the slow moving ionic charge. In order for the information stored in a 1T cell 10 in accordance with the present invention to be preserved, the polarization charge cannot be compensated. Any ionic charge that would slowly drift through the films and accumulate at the ferroelectric interfaces to the electrodes could compensate the polarization charge over time and destroy the information.

Another challenge encountered in building a 1T ferroelectric memory cell 10 is integration onto a manufacturing process, e.g. CMOS. Since the ferroelectric thin film is part of the gate of a transistor, it has to be deposited early in the fabrication process during the formation of the transistors. That means that the material has to be able to withstand a considerable thermal budget without unacceptable device degradation. Currently used ferroelectric materials are not optimum for this application since they degrade at temperatures above about 800° C. for extended times. (e.g. hours).

Processing temperatures encountered after ferroelectric film deposition in 1T cell technology typically reach 900° C., which is beyond the capabilities of current materials such as PZT and SBT. In accordance with the technique of the present invention, it will be shown that the rare earth manganites actually require high temperature processing (~900° C.) and are, therefore, ideal for fabricating ferroelectric transistors.

The ferroelectric material utilized in the present invention may be, as previously described, advantageously deposited directly onto the silicon substrate and may be composed of any rare-earth manganite or Yttrium or Scandium manganite with the general formula $A_xMn_yO_z$ (where A=Y, Ce, Pr, Nd, Pm, Sm, Eu, Gd, Tb, Dy, Ho, Er, Tm, Yb, Lu or Sc) and x,y,z are between 0.1 and 10.

It should be noted that most rare earth manganites are uniaxial ferroelectrics in hexagonal crystal formation, with some in a cubic crystal lattice. These rare earth manganites possess properties that are particularly suitable for 1T cell type memory cells, in accordance with the disclosure of the present invention. For example, their transition temperatures (Curie temperatures) are high relative to the maximum operating temperature of a circuit, in the range of approximately 500 to 700° C. providing a large margin for the high temperature limit of operating the device. This property is also linked to the high ferroelectric phase formation temperature that allows insertion of the ferroelectric film into a manufacturing process early in the process flow, for example, prior to source/drain formation. The material can withstand the processing temperatures of >850° C. that is required to, for example, activate the junctions.

Rare earth manganites also exhibit low dielectric permittivties, in the range from approximately 10 to 50, due to the closely packed crystal lattice in a hexagonal structure. The interfacial layer 31, on the other hand, has relatively high dielectric permittivities, in the range of substantially 10 to 30, because it is a mixture of the rare earth oxide $A_xO_z$ and the silicon oxide $Si_vO_w$. The interfacial layer 31 is, therefore, most likely non-stoichiometric with x,y,v, and w in the range of 0.1 to 10. In a preferred embodiment, the range for x,y,v and w is approximately 1 to 3. For example $Ce_2O_3$, $Y_2O_3$ and $Pr_2O_3$, exemplary preferred embodiments of the present invention, have relative dielectric permittivties of about 25, 20 and 30, respectively.

As also mentioned previously, the interfacial layer 31 may be formed either automatically during CVD deposition of the rare earth manganite, enhanced by the subsequent anneals in $O_2$, or may be deposited or otherwise formed deliberately, preferably by MOCVD in the same processing chamber and prior to the ferroelectric deposition. Deliberate deposition has the advantage that the dielectric permittivity ratio may be better optimized such that a selected rare earth oxide may be employed for the interfacial layer (e.g. $Pr_2O_3$) while one with a different rare earth in the manganate may be used for the ferroelectric layer (e.g. $CeMnO_3$). Using liquid delivery methods of the precursors allows easy deposition of this interfacial oxide. The interfacial layer 31 can also be formed by other means, for example by sputtering, e-beam evaporation or other known techniques.

While, in a representative embodiment of the present invention, the ferroelectric layer is preferably deposited using MOCVD techniques, other techniques such as MOD, sol-gel, PECVD and the like can be used and fall within the scope of the invention as claimed. The preferred embodiment, incorporating the formation of the ferroelectric layer by MOCVD, may be carried out by using a liquid source delivery technique as described, for example, in U.S. Pat. No. 5,887,117, for: "Flash Evaporator", the disclosure of which is herein specifically incorporated by this reference. An important element of this method involves the use of a suitable precursor chemistry. A preferred embodiment might use Cerium (IV) tris-tetramethylheptanedionate (thd) for Cerium (Ce), Manganese (III) tris-tetramethylheptanedionate for Manganese (Mn) and tetrahydrofuron (THF) as the solvent.

The following Table 1 lists some typically preferred deposition conditions for depositing $CeMnO_3$.

TABLE 1

| | |
|---|---|
| Deposition temperature | 650° C., |
| Chamber pressure | 20 Torr |
| Rotational speed of the wafer holder | 900 rpm |
| Typical deposition time for 250 nm | 27 min. |
| Evaporator dome and shell temperature | 333° C. |
| Line temperatures | 345° C. |
| Reactor gas flow rates | Ar: 1,000 sccm, $O_2$: 3,750 sccm |
| Evaporator carrier gas flow rate | Ar: 150 sccm |

After deposition, the ferroelectric films may e annealed in $O_2$ at temperatures of around 800 to 950° C. in order to form the proper ferroelectric phase. This anneal operation also increases the thickness of the interfacial layer, an added advantage, since it improves the quality and reliability of this important oxide layer. The relatively high anneal temperature, which would be found to be detrimental in prior art ferroelectric memory devices, is not a problem as the ferroelectric films may be inserted into the process flow early, for example, prior to source and drain formation.

Figure 3A:
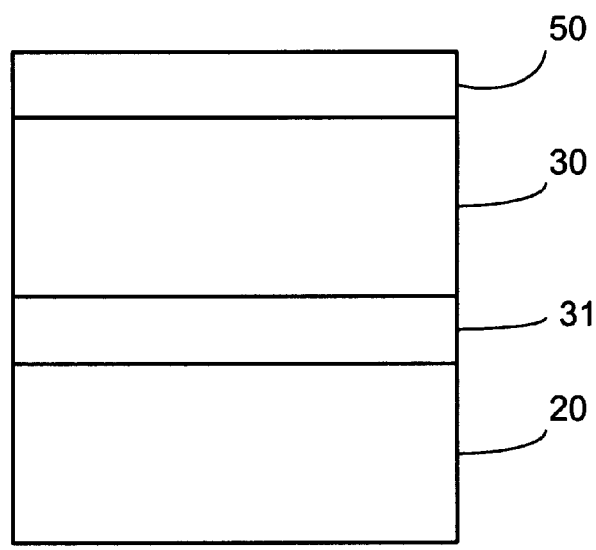
FIG. 3A depicts a simplified cross-section through the gate area of a ferroelectric transistor in accordance with the present invention.
Figure 3B:
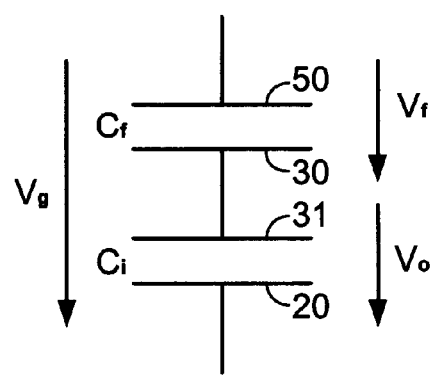
FIG. 3B illustrates the voltage drops over the ferroelectric thin film and the interfacial layer as shown in schematic form.

The combination of a low relative dielectric permittivity ferroelectric material in conjunction with a high relative dielectric permittivity oxide interfacial layer is a significant factor in the efficaciousness of the present invention and will be discussed in greater detail with reference additionally now to FIGS. 3A and 3B. The former figure shows a simplified cross-section taken through the gate area of a ferroelectric transistor in accordance with the present invention whereas the later figure is a corresponding schematic representation of the two capacitors formed by the ferroelectric layer and the interfacial layer, respectively, connected in series. The applied gate voltage $V_g$ between gate 50 and substrate 20 is divided between the ferroelectric layer 30 ($V_f$) and the interfacial layer 31 ($V_o$) according to the formula $$V_g = V_f + V_o.$$

The voltage $V_f$ is given by the equations below.

$$\epsilon_f V_f t_o = \epsilon_o V_o t_f$$

$$V_f = (\epsilon_o/\epsilon_f)(t_f/t_o)V_o = [1/(1+(\epsilon_f/\epsilon_o)(t_o/t_f))]V_g$$

where $t_f$ is the thickness of the ferroelectric layer and $t_o$ the thickness of the oxide layer. The effective voltage $V_g$ applied to the ferroelectric film is reduced by the ratio of dielectric permittivities of the interfacial layer 31 and the ferroelectric films. In order to maximize the available voltage applied to the ferroelectric film, the voltage available for switching, the ratios ($\epsilon_f/\epsilon_o$) and ($t_o/t_f$) should be made as low as possible. The rare earth manganites, in accordance with the representative embodiment of the present invention disclosed, satisfy this requirement.

The gate electrode 50 may be formed of a conducting material consistent with CMOS processing. In prior art FeRAM devices, noble metals such as Pt are typically used in order to prevent the formation of unwanted oxides at the interfaces. In accordance with the present invention, oxide interfacial layers are not critical due to the relatively low dielectric permittivity of the rare earth manganites. The thickness ratio of the ferroelectric layer to that of the interfacial layer can be as small as approximately 3:1, e.g. 60 nm thickness of a ferroelectric layer to 20 nm for the interfacial layer. A much wider range of gate electrode materials can then be used including, for example, noble metals, conductive oxide and, most importantly, doped polycrystalline silicon or metal suicides. These latter materials are particularly attractive since they are inexpensive and compatible with current CMOS processing techniques.

Figure 4:
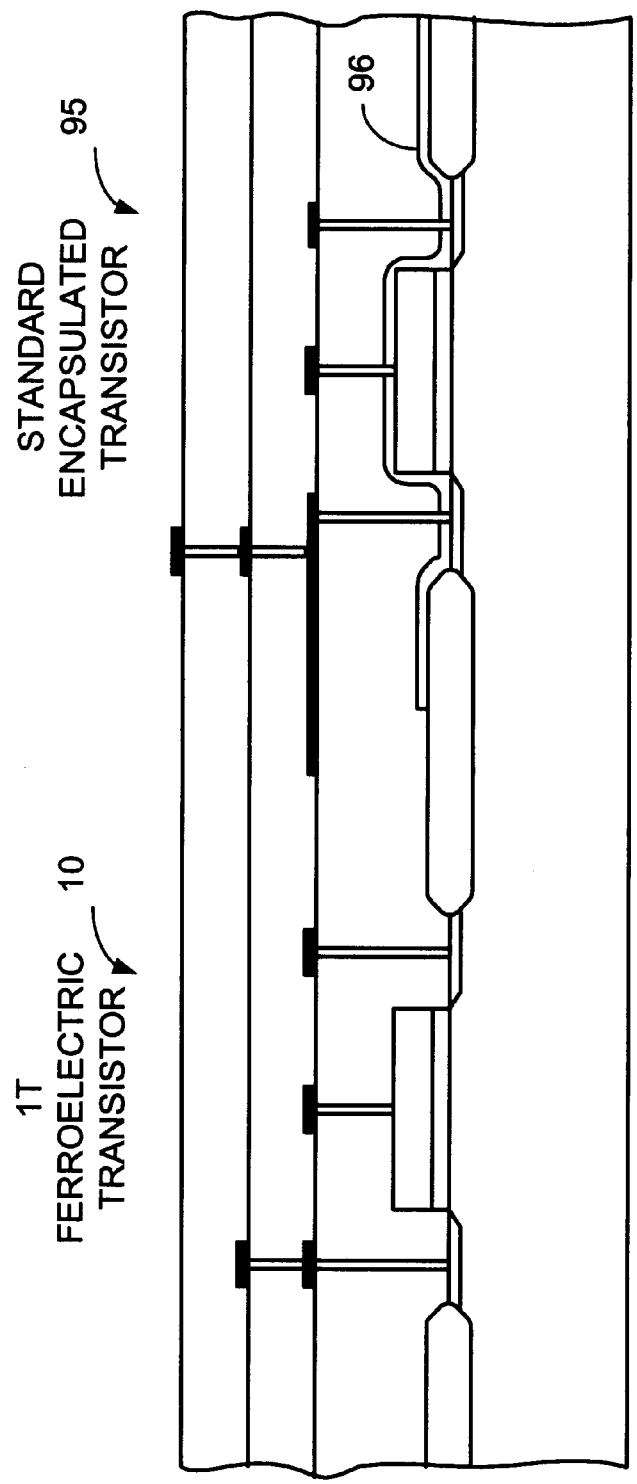
FIG. 4 illustrates a ferroelectric transistor in accordance with the disclosure of the present invention as integrated, for example, into a standard CMOS manufacturing process.

A ferroelectric transistor in accordance with the present invention can, therefore, be integrated into a standard CMOS manufacturing process to result in a structure shown, for example, in FIG. 4. The ferroelectric transistor (or memory cell) 10 can be formed prior to or after the formation of the standard CMOS transistors 95. If the ferroelectric transistor 10 is formed prior to the standard CMOS transistors 95, it may be preferably encapsulated by a thin layer of a barrier material 96 that prevents any possible out diffusion of the materials composing the rare earth manganite films which might possibly contaminate the remainder of the CMOS structure. This barrier material can be silicon nitride, aluminum oxide or other suitable materials. If the ferroelectric transistor 10 is formed after the standard CMOS transistors 95, the standard CMOS transistors may be encapsulated with a barrier material 96 to avoid any contamination from the any possible out diffusion of the materials composing the rare earth manganite films.

While there have been described above the principles of the present invention in conjunction with specific device structures, materials and process steps, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device comprising at least one memory cell comprising:

a substrate having source and drain regions formed therein;

an interfacial layer overlying said substrate substantially intermediate said source and drain regions;

a ferroelectric layer overlying said interfacial layer;

a gate electrode overlying said ferroelectric layer; and wherein said interfacial layer substantially comprises silicon, oxygen and at least one of the elements selected from the group comprising A=Y, Ce, Pr, Nd, Pm, Sm, Eu, Gd, Tb, Dy, Ho, Er, Tm, Yb, Lu or Sc having the general formula $Si_xO_yA_z$, where x, y, and z are values between about 0.1 and 10.

2. The integrated circuit device of claim 1 wherein said substrate comprises Si.

3. The integrated circuit device of claim 1 wherein said ferroelectric layer substantially comprises a material having a general formula $A_xMn_yO_z$, where x,y,z vary from about 0.1 to 10 and A is a rare earth selected from a group comprising Ce, Pr, Nd, Pm, Sm, Eu, Gd, Tb, Dy, Ho, Er, Tm, Yb, Lu, Y or Sc.

4. The integrated circuit device of claim 1 wherein said gate electrode is selected from a group comprising platinum, gold or any other noble metal.

5. The integrated circuit device of claim 1 wherein said gate electrode is selected from a group comprising iridium, rhodium, ruthenium or oxides thereof.

6. The integrated circuit device of claim 1 wherein said gate electrode is selected from a group comprising doped polycrystalline silicon or a metal silicide.

7. An integrated circuit device formed on a single substrate including a memory array having a plurality of memory cells coupled to at least one word line, plate line and bit line of said memory array, at least one of said memory cells comprising:

a 1T transistor having a ferroelectric dielectric formed intermediate of said substrate and a control terminal thereof coupled to said word line, said transistor further comprising first and second terminals coupled respectively to said bit line and plate line;

an interfacial layer in contact with said ferroelectric dielectric interposed between said ferroelectric dielectric and said substrate; and wherein said interfacial layer is an oxide of a material selected from a group comprising A=Y, Ce, Pr, Nd, Pm, Sm, Eu, Gd, Tb, Dy, Ho, Er, Tm, Yb, Lu or Sc having the general formula $A_xSi_yO_z$, where x,y are values between about 0.1 and 10.

8. The integrated circuit device of claim 7 wherein said ferroelectric dielectric is selected from a group comprising rare earth, Yttrium or Scandium manganates.

9. The integrated circuit device of claim 7 wherein a ratio of a thickness of said ferroelectric layer to that of said interfacial layer is substantially 3:1 or less.

* * * * *